United States Patent
Rockwell et al.

(10) Patent No.: US 7,396,617 B2
(45) Date of Patent: Jul. 8, 2008

(54) PHOTOMASK RETICLE HAVING MULTIPLE VERSIONS OF THE SAME MASK PATTERN WITH DIFFERENT BIASES

(75) Inventors: Barry K. Rockwell, Round Rock, TX (US); Jeffrey W. Tracy, Round Rock, TX (US); Edward Vokoun, Fair Oaks Ranch, TX (US)

(73) Assignee: Photronics, Inc., Brookfield, CT (US)

( * ) Notice: Subject to any disclaimer, the term of this patent is extended or adjusted under 35 U.S.C. 154(b) by 650 days.

(21) Appl. No.: 10/866,976

(22) Filed: Jun. 14, 2004

(65) Prior Publication Data

US 2005/0277032 A1  Dec. 15, 2005

(51) Int. Cl.
*G03F 1/00* (2006.01)
(52) U.S. Cl. .......................................... 430/5
(58) Field of Classification Search ............... 430/5, 430/322–324, 394
See application file for complete search history.

(56) References Cited

U.S. PATENT DOCUMENTS

| | | | |
|---|---|---|---|
| 2,751,294 A | 6/1956 | Morrison | |
| 3,716,296 A | 2/1973 | Springer et al. | |
| 3,900,737 A | 8/1975 | Collier et al. | |
| 5,523,186 A | 6/1996 | Lin et al. | |
| 5,604,059 A | 2/1997 | Imura et al. | |
| 5,866,280 A | 2/1999 | Ito et al. | |
| 5,917,579 A | 6/1999 | Miyajima | |
| 5,985,492 A | 11/1999 | Wheeler et al. | |
| 6,004,699 A | 12/1999 | Yasuzato et al. | |
| 6,042,972 A | 3/2000 | Schulze | |
| 6,103,429 A | 8/2000 | Doyle et al. | |
| 6,136,517 A | 10/2000 | Fletcher | |
| 6,153,342 A | 11/2000 | Doyle et al. | |
| 6,194,105 B1 | 2/2001 | Shacham et al. | |
| 6,280,888 B1 | 8/2001 | Nakabayashi et al. | |
| 6,348,287 B1 | 2/2002 | Lin | |
| 6,421,111 B1 | 7/2002 | Pierrat | |
| 6,451,508 B1 | 9/2002 | Bukofsky et al. | |
| 6,472,107 B1 | 10/2002 | Chan | |
| 6,472,766 B2 | 10/2002 | Xiao | |
| 6,528,216 B2 | 3/2003 | Park | |
| 6,536,032 B1 * | 3/2003 | Tanaka et al. ................. 716/21 |

(Continued)

FOREIGN PATENT DOCUMENTS

JP  08179492  7/1996

(Continued)

OTHER PUBLICATIONS

Photronics, Inc.: Photomask & Reticle Lithography Solutions, at http://www.photronics.com/about/basics.jsp, Mar. 2004.

*Primary Examiner*—Stephen Rosasco
(74) *Attorney, Agent, or Firm*—Amster, Rothstein & Ebenstein LLP

(57) ABSTRACT

A reticle includes at least two duplicate mask patterns each having a different bias. A reticle according to at least one embodiment of the invention includes a first mask pattern, a second mask pattern and a third mask pattern, each of the first mask pattern, second mask pattern and third mask pattern being duplicates of one another and having a different bias.

23 Claims, 4 Drawing Sheets

U.S. PATENT DOCUMENTS

| | | |
|---|---|---|
| 6,541,165 B1 | 4/2003 | Pierrat |
| 6,541,166 B2 * | 4/2003 | Mansfield et al. .............. 430/5 |
| RE38,126 E | 5/2003 | Tew et al. |
| 6,567,588 B2 | 5/2003 | Unruh |
| 6,569,583 B2 | 5/2003 | Cho et al. |
| 6,620,561 B2 | 9/2003 | Winder et al. |
| 6,646,722 B2 | 11/2003 | Pierrat |
| 6,653,026 B2 | 11/2003 | Pierrat et al. |
| 6,670,080 B2 | 12/2003 | Sugita et al. |
| 6,677,088 B2 | 1/2004 | Magome et al. |
| 6,710,851 B1 | 3/2004 | Elmer et al. |
| 6,713,231 B1 | 3/2004 | Hasegawa et al. |
| 6,775,815 B2 | 8/2004 | Ki et al. |
| 7,079,235 B2 * | 7/2006 | Lehman .................... 356/237.1 |
| 7,139,998 B2 * | 11/2006 | Fukuhara et al. .............. 716/21 |
| 2003/0039897 A1 | 2/2003 | Morita |
| 2003/0134205 A1 | 7/2003 | Yu |
| 2004/0072083 A1 | 4/2004 | Saitou et al. |
| 2005/0277033 A1 | 12/2005 | Rockwell |

FOREIGN PATENT DOCUMENTS

| | | |
|---|---|---|
| JP | 2003-315974 | 11/2003 |

* cited by examiner

PHOTOMASK RETICLE HAVING MULTIPLE VERSIONS OF THE SAME MASK PATTERN WITH DIFFERENT BIASES

FIELD OF THE INVENTION

The present invention relates to photomasks used in semiconductor wafer fabrication and methods of manufacturing the same. In particular, the present invention relates to photomasks with multiple versions of the same mask pattern having different biases to compensate for process errors that occur during exposure to form a semiconductor wafer.

BACKGROUND OF THE INVENTION

There are a wide variety of photomasks known in the art, as well as diverse uses to which they can put, as described in, e.g., U.S. Pat. Nos. 6,472,107 and 6,567,588. Among the many types of photomasks used in the semiconductor industry, binary and phaseshift photomasks are quite common. A typical binary photomask is comprised of a substantially transparent substrate 2 and opaque layer 4, in which a pattern is formed, as shown in a cross sectional illustration of an unprocessed binary photomask in FIG. 1A. Further, the opaque layer 4 may also have an anti reflective ("AR") coating 6. The pattern of the opaque material in the opaque layer 4 and AR material in the AR coating 6 on the substantially transparent substrate 2 may be a scaled negative of the image desired to be formed on the semiconductor wafer. For a typical chrome on glass ("CoG") or binary photomask, the substantially transparent substrate 2 is comprised of quartz. The opaque material 4 is comprised of chromium ("Cr") and the AR material is comprised of chromium oxide ("CrO").

A binary photomask used in the production of semiconductor devices is formed from a "blank" photomask. As shown in FIG. 1A, a prior art blank photomask 1 is commonly comprised of at least four layers. The first layer 2 is a substantially transparent substrate, such as quartz, commonly referred to as the substrate. The next layer above the substantially transparent layer 2 is an opaque layer 4, which is comprised of Cr in the case of a typical CoG photomasks. Thereafter, although not always necessary, there may be an AR layer 6 integral to the opaque layer, which in the case of CoG photomasks is comprised of CrO. A layer of photosensitive resist material 8 resides as the top layer. In the case of CoG photomasks, the photosensitive resist material 8 is typically a hydrocarbon polymer, the various compositions and thicknesses of which are well known in the art. Other layers may also be present for alternative reasons, as is described, for example, in U.S. Pat. No. 6,472,107. Similarly, other materials may be used as is well known in the art.

The desired pattern of opaque material to be created on the photomask may be defined by an electronic data file loaded into an exposure system which typically scans an electron beam (E beam) or laser beam in a raster fashion across the blank photomask. One such example of a raster scan exposure system is described in U.S. Pat. No. 3,900,737. Other imaging systems can be used that do not use raster scanning, such as shaped vector tools. As the E beam or laser beam is scanned across the blank photomask, the exposure system directs the E beam or laser beam at addressable locations on the photomask as defined by the electronic data file. In the case of a positive photoresist, the areas that are exposed to the E beam or laser beam become soluble, while the unexposed portions remain insoluble. In the case of a negative photoresist, the unexposed areas become soluble, while the exposed portions remain insoluble. As shown in FIG. 1B, after the exposure system has scanned the desired image onto the photosensitive resist material, the soluble photosensitive resist is removed by means well known in the art, and the insoluble photosensitive resist material 8a remains adhered to the next layer (e.g., the AR layer 6).

After undergoing the foregoing photolithographic process, as illustrated in FIG. 1C, the exposed layer of AR material 6 and the underlying layer of opaque material 4 are no longer covered by the photosensitive resist material 8a and are removed by a well known etch process. Only the portions of the layer of AR material 6a and the layer of opaque material 4a residing beneath the remaining photosensitive resist material 8a remain affixed to the substantially transparent substrate 2. This initial or base etching may be accomplished by either a wet etching or dry etch process, both of which are well known in the art.

Another type of photomask used for transferring images to a semiconductor wafer is commonly referred to as a phaseshift photomask. Phaseshift photomasks are generally preferred over binary photomasks when the design to be transferred to the semiconductor wafer includes smaller, tightly packed feature sizes which are below the resolution capabilities of optical equipment being used. Phaseshift photomasks are engineered to be 180 degrees out of phase with light transmitted through etched areas on the photomask so that the light transmitted through the openings in the photomask is equal in amplitude.

One type of phaseshift photomask is commonly referred to as an embedded attenuated phaseshift mask (EAPSM). Other types of phaseshift masks are also known, and the teachings of the present invention may be equally applied thereto. As shown in FIG. 2A, a typical blank EAPSM 31 may be comprised of four layers. The first layer is a typically a substantially transparent material 33 (such as quartz, for example) and is commonly referred to as a substrate. The next layer is typically an embedded phaseshifting material ("PSM layer") 35, such as molybdenum silicide (MoSi), tantalum silicon nitride (TaSiN), titanium silicon nitride (TiSiN), zirconium silicon oxide (ZrSiO), or other known phase materials. The next layer is typically an opaque material 37, such as chromium, which may optionally include an anti reflective coating such as chromium oxynitride (CrON). The top layer is a photosensitive resist material 39, as is well known in the art.

The method for processing a conventional EAPSM is now described. As with binary photomasks, the desired pattern of the opaque material to be created on the EAPSM is typically scanned by an electron beam (E beam) or laser beam in a raster or vector fashion across a blank EAPSM 31. As the E beam or laser beam is scanned across the blank EAPSM 31, the exposure system directs the E beam or laser beam at addressable locations on the EAPSM. In the case of a positive photoresist material, the areas that are exposed to the E beam or laser beam become soluble, while the unexposed portions remain insoluble. In the case of a negative photoresist, the unexposed areas become soluble, while the exposed portions remain insoluble.

As is done with binary photomasks and as shown in FIG. 2B, after the exposure system has scanned the desired image onto the photosensitive resist material 39, the soluble photosensitive resist material is removed by means well known in the art, and the insoluble photosensitive resist material 39a remains adhered to the opaque material 37. Thus, the pattern to be formed on the EAPSM is formed by the remaining photosensitive resist material 39a.

The pattern is then transferred from the remaining photosensitive resist material 39a to the opaque layer 37 and PSM layer 35 via well known etching techniques, such as plasma assisted etch described above, by etching away the portions of the opaque layer and PSM layer not covered by the remaining photoresist. After etching is completed, the remaining photoresist material is stripped or removed as shown in FIG. 2C. Other processing steps, such as partial or complete etching of the opaque layer 37a, may be further performed to complete the fabrication of the phaseshift photomask.

Photomasks are used in the semiconductor industry to transfer micro scale images defining a semiconductor circuit onto a silicon or gallium arsenide substrate or wafer and the like. To create an image on a semiconductor wafer, the photomask is interposed between the semiconductor wafer, which includes a layer of photosensitive material, and a stepper, which houses an energy source, such as a lamp or a laser. The energy generated by the stepper passes through the transparent portions of the substantially transparent substrate not covered by the opaque material (and, if utilized, the anti reflective and/or phaseshift material) and causes a reaction in the photosensitive material on the semiconductor wafer. Energy from the stepper is prevented from passing through the opaque portions of the photomask. As with the manufacture of photomasks, when the photosensitive material is exposed to light it will react. Thereafter, the soluble photosensitive material is removed using processes well known in the prior art. The semiconductor wafer is then etched in a manner similar to that described above. After further processing, a semiconductor product is formed.

As semiconductor chip features become exponentially smaller and the number of transistors per device become exponentially larger, large burdens have been placed on lithography processes. Resolution of anything smaller than a wavelength of exposure radiation is generally quite difficult, and pattern fidelity can deteriorate dramatically in sub-wavelength lithography. The resulting semiconductor features may deviate significantly in size and shape from the ideal pattern drawn from the circuit designer. This will decrease process yield and increase cost of the overall photomask manufacturing process.

The semiconductor industry is driven by a desire to lessen processing time and increasing process yield while maintaining or even reducing current costs. In particular, regarding lithograpy techniques using photomasks, the semiconductor industry has attempted to reduce process errors to increase yield by compensating for these process errors in the photomasks themselves. For example, when an image is transferred to a wafer by a 4× stepper tool using a photomask with a critical dimension (CD) of 100 nm, the resulting device layer on the wafer may have a line width of 28 nm. Accordingly, the semiconductor manufacturer will often request that the CD of the photomask be adjusted (or "biased") so that, when the photomask pattern is developed on the semiconductor wafer, the resulting product will have the desired line width of 25 nm instead of 28 nm.

As a further example, U.S. Patent Application Publication No. 2003/0134205 ("the '205 application") discloses a process for manufacturing a photomask in which, for each pitch within a semiconductor design, a bias needed at the pitch that maximizes a common process window for all the pitches is calculated based on the given critical dimension (CD) of the mask design. The '205 application combines this biasing with optical proximity correction to appropriately modify the original layout of the photomask. However, techniques such as that disclosed in the '205 application are costly and increase turn-around time due to the required inspection steps and correction analysis.

Other techniques have been adopted to decrease cost of the photomask manufacturing process, which do not relate directly to reducing process errors or increasing yield. Such techniques often involve using multiple mask patterns on a common reticle or plate. For example, U.S. Pat. No. 6,421,111 discloses a multiple image reticle including a two dimensional array of spaced images, which obviates the need for rotation of the reticle to expose various levels of circuitry on a semiconductor wafer.

Similarly, U.S. Patent Application Publication No. 2004/0072083 discloses a photomask including a plurality of mask patterns, each used in an associated photolithography step and corresponding to an associated semiconductor layer, where the mask patterns are arranged so that the photomask is always used oriented in substantially the same direction.

Finally, U.S. Pat. No. 5,604,059 discloses a mask structure including a plurality of duplicating first device patterns and a plurality of duplicating second device patterns. The first device patterns are used to expose a first part of a semiconductor pattern and the second device patterns are used to expose a second part of the semiconductor pattern over the exposed first part.

In none of the prior art references is there disclosed the use of single photomask reticle having multiple versions of the same mask pattern, where different biasing is used.

It is an object of the present invention to provide a reticle that increases process yield and decreases turn-around time by compensating for process errors.

It is a further object of the present invention to provide an improved reticle which has multiple versions of the same mask pattern with different biasing.

Other objects and advantages of the present invention will become apparent from the following description.

SUMMARY OF THE INVENTION

It has now been found that the above and related objects of the present invention are obtained in the form of several related aspects, including providing a single reticle having multiple versions of the same mask pattern with different biasing.

A reticle according to an exemplary embodiment of the present invention includes at least two duplicate mask patterns each having a different bias.

A reticle according to another exemplary embodiment of the invention includes a first mask pattern, a second mask pattern and a third mask pattern, each of the first mask pattern, second mask pattern and third mask pattern being duplicates of one another and having a different bias.

The first mask pattern may be formed at a central region of the reticle, the second mask pattern may be formed adjacent to the first mask pattern at a side portion of the reticle, and the third mask pattern may be formed adjacent to the first mask pattern at another side portion of the reticle.

The first mask pattern may have no bias, the second mask pattern may have a negative bias, and the third mask pattern may have a positive bias.

A reticle according to another exemplary embodiment of the invention includes a first set of a plurality of duplicate mask patterns and a second set of a plurality of duplicate mask patterns, each of the mask patterns in each set having a different bias.

The first set of a plurality of duplicate mask patterns may include a first mask pattern, a second mask pattern and a third mask pattern, each of the first mask pattern, second mask pattern and third mask pattern having a different bias.

The second set of a plurality of duplicate mask patterns may include a fourth mask pattern, a fifth mask pattern and a sixth mask pattern, each of the fourth mask pattern, fifth mask pattern and sixth mask pattern having a different bias.

A method of forming a reticle according to an exemplary embodiment of the invention includes providing a blank reticle, and forming at least two duplicate mask patterns in the blank reticle, each of the at least two duplicate mask patterns having a different bias.

The step of forming at least two duplicate mask patterns may include the steps of exposing a photosensitive resist material layer to light to form an image corresponding to the at least two duplicate mask patterns having different biases, removing portions of the photosensitive resist material layer to expose corresponding portions of an opaque material layer below the photosensitive resist material layer, and etching the exposed portions of the opaque material layer to form the at least two duplicate mask patterns having different biases in the blank reticle.

The step of forming at least two duplicate mask patterns may include forming a first mask pattern, a second mask pattern and a third mask pattern, each of the first mask pattern, second mask pattern and third mask pattern having a different bias.

The first mask pattern may be formed with no biasing, the second mask pattern may be formed with positive biasing and the third mask pattern may be formed with negative biasing.

A method of forming a semiconductor layer of a semiconductor device according to an exemplary embodiment of the invention includes interposing a reticle between an energy source and a semiconductor wafer, the reticle comprising at least two duplicate mask patterns each having a different bias, and passing energy through one of the at least two mask patterns using the energy source to form an image on the semiconductor wafer, the one of the at least two duplicate mask patterns being chosen based on a required bias.

BRIEF DESCRIPTION OF THE DRAWINGS

The above and related objects, features and advantages of the present invention will be more fully understood by reference to the following, detailed description of the preferred, albeit illustrative, embodiment of the present invention when taken in conjunction with the accompanying figures, wherein.

DETAILED DESCRIPTION OF THE INVENTION

Figure 1A:
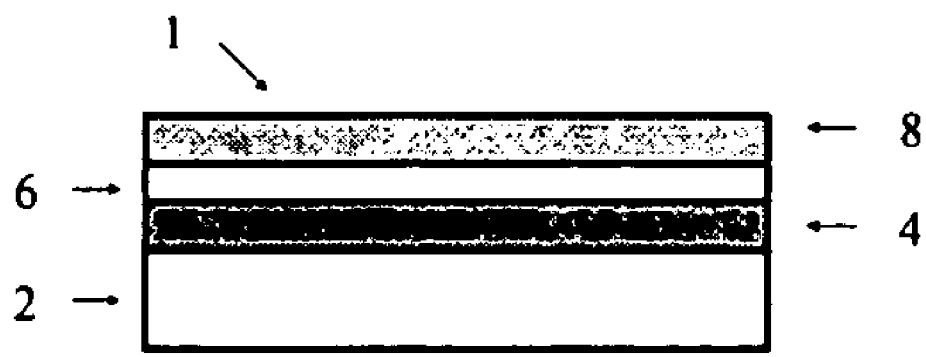
FIGS. 1A-1C are vertical sectional views showing various steps of a method of forming a conventional photomask.
Figure 1B:
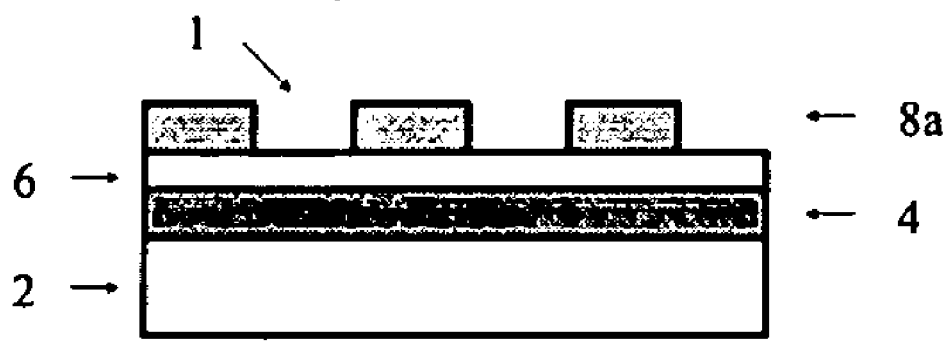
Figure 1C:
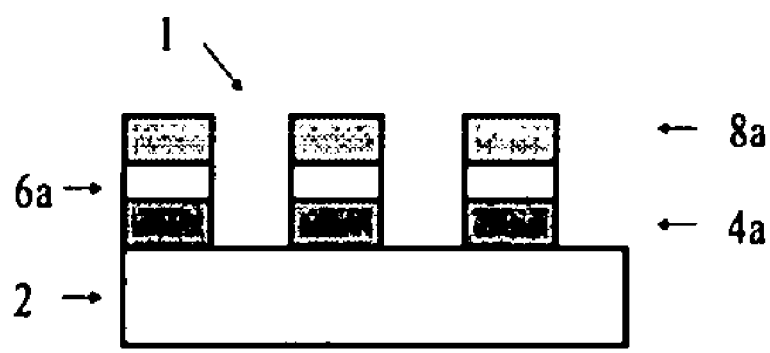
Figure 2A:
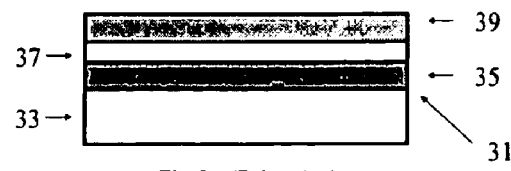
FIGS. 2A-2C are vertical sectional views showing various steps of a method of forming another conventional photomask.
Figure 2B:
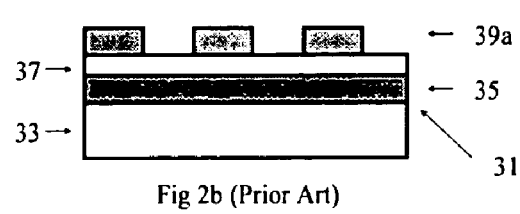
Figure 2C:
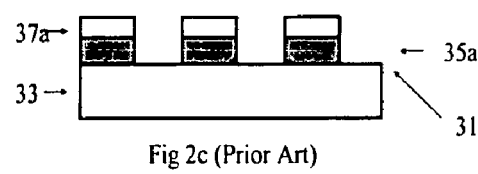

The present invention generally relates to the use of multiple copies of the same mask pattern on a reticle using different biases, e.g., +5 nm, 0 nm, and −5 nm. The invention is equally applicable to different ranges and number of copies, as long as two or more copies have different biases on the same photomask. This example would allow a photomask customer/semiconductor manufacturer to choose three (or more) alternative masks patterns depending on the biasing that is appropriate for the particular stepper equipment for which the reticle is to be used. In essence, multiple field biases offer the end user a measure of "tuning" for their imaging systems.

In various exemplary embodiments of the invention, multiple mask patterns are formed on a reticle plate. Each mask pattern is duplicated any number of times on the plate, with each duplicate mask pattern having a different bias. For example, a first mask pattern on the plate can have a bias of 0 nm, a duplicate second mask pattern can be formed along side the first mask pattern with a bias of +5 nm, and a duplicate third mask pattern can be formed along side the first mask pattern with a bias of −5 nm. The number and location of the various patterns relative to each other and the relative biases are provided merely as an illustrative example and are not intended to limit the scope of the present invention. Thus, each mask pattern can have any suitable bias that satisfies process parameters required by the customer. By way of illustration, suitable biases may be (−10 nm, 0 nm, +10 nm), (−15 nm, 0 nm, +15 nm) and (−20 nm, 0 nm, +20 nm). The various exemplary embodiments of the invention are not restricted to 2-3 duplicates of a single pattern, and any number of duplicate patterns having different biases that can fit on a single reticle can be implemented. Further, the bias does not have to be restricted to a plus bias and a negative bias disposed around a central zero bias, but can be one sided (e.g., 0 nm, +5 nm, +10 nm), or asymmetric (e.g., −5 nm, 0 nm, +5 nm, +10 nm) and can be any incremental value (e.g., +1 nm, +2 nm or −7.5 nm, +2.5 nm, +12.5 nm).

Further, in various exemplary embodiments, the duplicate reticle mask patterns can be laid out on the reticle plate in any suitable manner. For example, a first group of duplicate mask patterns can be formed on the plate along with a second group of duplicate mask patterns, so that each layer of the semiconductor device associated with a duplicate mask pattern can be formed using multiple biases. Further, the duplicate mask patterns having the different biases can be formed on the same reticle with mask patterns that are not formed in duplicate. In this case, preferably only important and time sensitive masks would be formed multiple times with different biases, and other masks that are not as crucial would not be formed in duplicate. Of course, the application of the present invention is not intended to be limited to only important and time sensitive masks. Further, a first group of duplicate mask patterns can be formed on the plate along with a second group of duplicate mask patterns, with the first group being oriented in a first direction and the second group being oriented in a second direction. Similarly, any number of groups of one or more mask patterns that can fit on the reticle can be used, with any appropriate combination or orientation as long as at least one group has at least two members with different biases.

Figure 3:
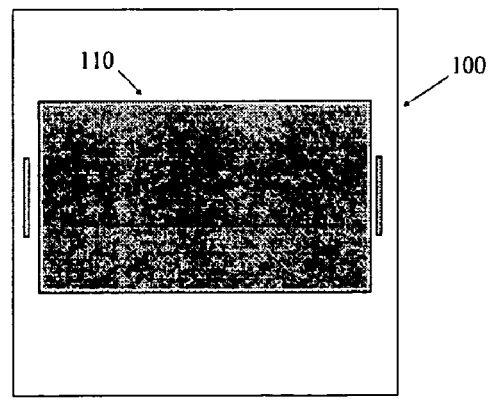
FIG. 3 is a plan view of a conventional mask pattern formed on a reticle plate.
Figure 4:
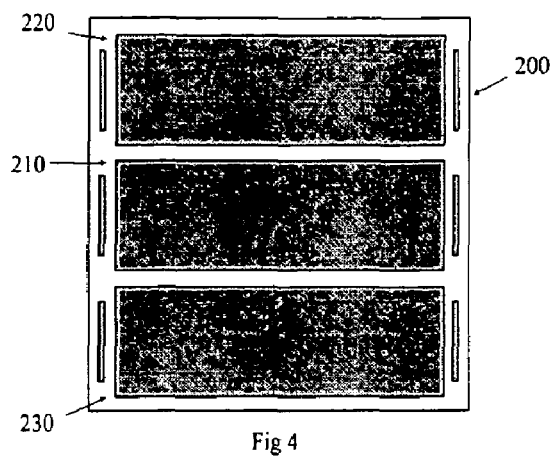
FIG. 4 is a plan view of multiple duplicate mask patterns having different biases formed on a reticle according to an exemplary embodiment of the present invention.

FIGS. 3 and 4 are provided to explain the general concept of various exemplary embodiments of the present invention. FIG. 3 illustrates a conventional mask pattern 110 formed on a reticle 100. The mask pattern 110 is biased 0 nm, i.e., not biased, so that the exposure process to form a semiconductor layer using the reticle 1 is susceptible to process errors. For example, the mean to nominal specification of the semiconductor layer formed using the reticle 100 may be +10 nm due to process errors. Any "non-repairable" defect in the writing area of the reticle will result in a repeat of the value-added steps of the reticle manufacturing process, making them non-valued added cost adders.

FIG. 4 illustrates an example of multiple mask patterns 210, 220 and 230 formed on a reticle 200 according to an exemplary embodiment of the present invention. In the present embodiment, the reticle 200 includes three duplicate mask patterns having different biases. However, any number of duplicate mask patterns can be formed depending on the overall area of the reticle and the capabilities of the stepper used to expose the semiconductor device layers. The multiple mask patterns include a first mask pattern 210, a second mask pattern 220 and a third mask pattern 230. The first mask pattern 210 is formed in the middle region of the reticle 200, the second mask pattern 220 is formed adjacent to the first mask pattern 210 at one side region of the reticle 200, and the third mask pattern 230 is formed adjacent to the first mask pattern 210 at another side region of the reticle 200. The first, second and third mask patterns 210, 220 and 230 are duplicate mask patterns that can be used to form the same semiconductor layer, each having a different bias. The appropriate biasing of each duplicate mask pattern 210, 220 and 230 is based on customer latitude. For example, if the mean to nominal specification is +10 nm, the appropriate biasing may be 0 nm for the first photomask pattern 210, +10 nm for the second photomask pattern 220 and −10 nm for the third photomask pattern 230. Thus, the customer can choose from the three mask patterns 210, 220 and 230 the appropriately biased mask pattern that compensates for the process errors that occur during the semiconductor device fabrication steps. The choice of which photomask pattern has which bias is not a critical aspect of the present invention, such that any suitable order may be chosen. Other amounts of biasing may also be selected within the scope of the present invention.

The reticle 200 illustrated in FIG. 4 affords the customer greater flexibility regarding optimization of the photolithography process results. As an example, the customer may choose one of the mask patterns that compensates for manufacturing tendencies, but for some reason results in a single defect killer. The customer then has two other mask patterns to choose from that avoids the killer defect, and which at the same time provides appropriate biasing within manufacturing tolerances. The mask pattern that avoids killer defects can be used in conjunction with appropriate biasing of the stepper equipment to optimize the photolithography process.

Figure 5:
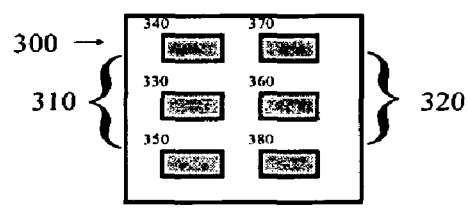
FIG. 5 is a plan view of multiple duplicate mask patterns having different biases formed on a reticle according to another exemplary embodiment of the present invention.

FIG. 5 illustrates multiple mask patterns formed on a reticle according to another exemplary embodiment of the present invention. In the present embodiment, the reticle 300 includes two sets of three duplicate mask patterns, each duplicate pattern in each set having a different bias. As shown in FIG. 5, the reticle 300 includes a first set 310 of mask patterns and a second set 320 of mask patterns. The first set 310 of mask patterns includes a first mask pattern 330, a second mask pattern 340 and a third mask pattern 350. The second set 320 of mask patterns includes a fourth mask pattern 360, a fifth mask pattern 370 and a sixth mask pattern 380. The first mask pattern 330 is formed in the middle region of the reticle 300, the second mask pattern 340 is formed adjacent to the first mask pattern 330 at one side region of the reticle 300, and the third mask pattern 350 is formed adjacent to the first mask pattern 330 at another side region of the reticle 300. Similarly, the fourth mask pattern 370 is formed in the middle region of the reticle 300, the fifth mask pattern 380 is formed adjacent to the fourth mask pattern 370 at one side region of the reticle 300, and the sixth mask pattern 380 is formed adjacent to the fourth mask pattern 360 at another side region of the reticle 300. The first, second and third mask patterns 330, 340 and 350 in the first set 310 of mask patterns are duplicate mask patterns that can be used to form the same semiconductor layer, where each of the first, second and third mask patterns 330, 340 and 350 has a different bias. Similarly, the fourth, fifth and sixth mask patterns 360, 370 and 380 in the second set 320 of mask patterns are duplicate mask patterns that can be used to form another semiconductor layer, where each of the fourth, fifth and sixth mask patterns 360, 370 and 380 has a different bias. Of course, the present invention is not limited to two sets of duplicate mask patterns having different biases. Any number of sets can be disposed on the reticle as long as each set contains at least two duplicate mask patterns having different biases. Preferably, each set would contain at least three duplicate mask patterns, where one pattern has no bias, one pattern has negative bias (e.g., −5 nm, −10 nm, −15 nm, −20 nm, etc.) and one pattern has positive bias (e.g., +5 nm, +10 nm, +15 nm, +20 nm, etc.).

Figure 6A:
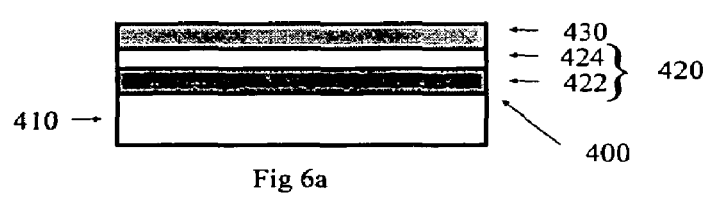
FIGS. 6A-6D are vertical sectional views showing various steps of a method of manufacturing a reticle having multiple duplicate mask patterns with different biases according to an exemplary embodiment of the invention.
Figure 6B:

FIGS. 6A-6D show various steps of a method of manufacturing a reticle having multiple duplicate mask patterns with different biases according to an exemplary embodiment of the invention. As shown in FIG. 6A, blank reticle 400 is comprised of a transparent material layer 410, an opaque layer 420 and a photosensitive resist material layer 430. The transparent material layer 410 is preferably made of quartz. The opaque layer 420 is formed on the transparent material layer 410 and is formed of a layer of Cr opaque material 422 and an integral layer of CrO AR material 424 formed on top of the layer of Cr opaque material 422. The layer of photosensitive resist material 430 resides on top of the opaque material layer 420. The photosensitive resist material 430 is typically a hydrocarbon polymer, the various compositions and thicknesses of which are well known in the art. The desired pattern of opaque material 420 to be created on the reticle 400 may be defined by an electronic data file loaded into an exposure system which typically scans an electron beam (E-beam) or laser beam in a raster fashion across the blank reticle. In exemplary embodiments of the invention, the data for each of the layers or mask patterns on the reticle can be duplicated and biased to produce multiple duplicate mask patterns having different biases in the final reticle 400. As the E-beam or laser beam is scanned across the blank reticle, the exposure system directs the E-beam or laser beam at addressable locations on the reticle as defined by the electronic data file. The areas of the photosensitive resist material that are exposed to the E-beam or laser beam become soluble while the unexposed portions remain insoluble. As shown in FIG. 6B, after the exposure system has scanned the desired image onto the photosensitive resist material, the soluble photosensitive resist is removed by means well known in the art, and the unexposed, insoluble photosensitive resist material 430 remains adhered to the CrO AR material 424. Accordingly, the remaining photosensitive resist material 430 forms patterns including patterns 432 that duplicate with different biasing.

Figure 6C:

As illustrated in FIG. 6C, the exposed opaque material layer 420 no longer covered by the photosensitive resist material 430 in the reticle 400 is removed by a well known etching process, and only the portions of the opaque material layer 420 residing beneath the remaining photosensitive resist material 430 remain affixed to quartz substrate 410. Accordingly, the duplicating multiple patterns 432 with different biases in the photosensitive resist material 430 are transferred to the opaque material layer 420 to form corresponding multiple duplicating mask patterns 422 in the opaque material layer 420. This initial or base etching may be accomplished by either a wet-etching or dry-etching process both of which are well known in the art.

Figure 6D:
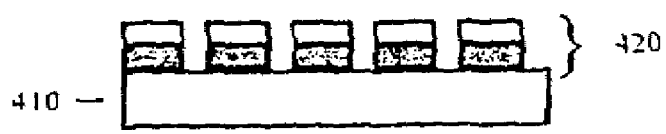

As shown in FIG. 6D, after the etching process is completed the photosensitive resist material 430 in the reticle 400 is stripped away by a process well known in the art.

Figure 7:
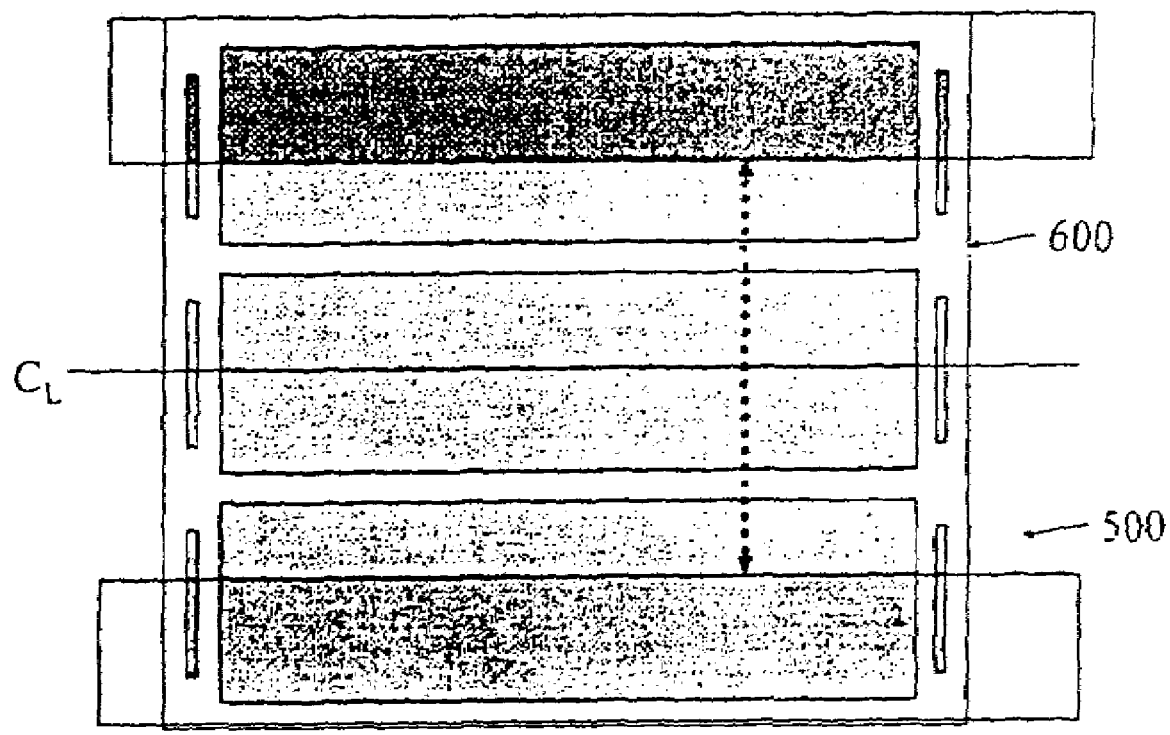
FIG. 7 is a plan view of a shuttle plane over a reticle having multiple duplicate mask patterns with different biases according to an exemplary embodiment of the invention.

In the various exemplary embodiments of the present invention in which a reticle having multiple duplicate masks with different biases is used to process a semiconductor layer, various issues may need to be addressed depending on the particular stepper being used to expose the semiconductor layer through the reticle. For example, one issue is that radial error may dominate uniformity/registration gains related to reduced field size. Another issue is that spherical aberration of the scanner lens may be too large when overlaying smaller fields to larger fields. Still another issue is that the scanner shuttle plane may be too small to adequately cover all the multiple duplicate mask patterns. This issue is illustrated in FIG. 7. FIG. 7 shows a shutter 500 of a scanner concentric to the center line of the reticle plane CL of a reticle 600 having three duplicate mask patterns with different bias. Due to the shutter limitations, the image fields may need to be rotated 90°, which would allow for use of any one of the three fields of the reticle 600.

Now that the preferred embodiments of the present invention have been shown and described in detail, various modifications and improvements thereon will become readily apparent to those skilled in the art. For example, the present invention is not limited to CoG photomasks, but also may be applied to other types of binary photomasks. Similarly, the present invention is not limited to EAPSM, but may also apply to other types of phaseshift photomasks, including by way of example, but not limited to, AAPSM (alternating aperture phase shift mask). Furthermore, application of the present invention is not limited to reticles having multiple versions of only one mask pattern with different biases. It could also apply to reticles having multiple versions of multiple mask patterns where each version of these mask patterns have different biases. Further, the inventive concept of multiple duplicate mask patterns having different biases to improve yield is not solely applicable to scanner technology. The concept is applicable to almost any microlithography approach. The present embodiments are therefore to be considered in all respects as illustrative and not restrictive, the scope of the invention being indicated by the appended claims, and all changes that come within the meaning and range of equivalency of the claims are therefore intended to be embraced therein.

What is claimed is:

1. A reticle comprising a first mask pattern, a second mask pattern and a third mask pattern, each of the first mask pattern, second mask pattern and third mask pattern being duplicates of one another and having a different bias.

2. The reticle of claim 1, wherein the first mask pattern is not biased, the second mask pattern has a negative bias, and the third mask pattern has a positive bias.

3. The reticle of claim 1, wherein the first mask pattern has a bias of 0 nm, the second mask pattern has a bias of +5 nm, and the third mask pattern has a bias of −5 nm.

4. The reticle of claim 1, wherein the first mask pattern has a bias of 0 nm, the second mask pattern has a bias of +10 nm, and the third mask pattern has a bias of −10 nm.

5. The reticle of claim 1, wherein the first mask pattern has a bias of 0 nm, the second mask pattern has a bias of +15 nm, and the third mask pattern has a bias of −15 nm.

6. The reticle of claim 1, wherein the first mask pattern has a bias of 0 nm, the second mask pattern has a bias of +20 nm, and the third mask pattern has a bias of −20 nm.

7. The reticle of claim 1, wherein the bias of each of the mask patterns is a negative bias.

8. The reticle of claim 1, wherein the bias of each of the mask patterns is a positive bias.

9. The reticle of claim 1, wherein the first mask pattern has a zero bias, and at least the second and third mask patterns have a positive bias.

10. The reticle of claim 1, wherein the first mask pattern has a zero bias, and at least the second and third mask patterns have a negative bias.

11. A reticle comprising at least two duplicate mask patterns each having a different bias.

12. A reticle comprising a first set of a plurality of duplicate mask patterns and a second set of a plurality of duplicate mask patterns, each of the mask patterns in each set having a different bias.

13. The reticle of claim 12, wherein the first set of a plurality of duplicate mask patterns comprises a first mask pattern, a second mask pattern and a third mask pattern, each of the first mask pattern, second mask pattern and third mask pattern having a different bias.

14. The reticle of claim 13, wherein the second set of a plurality of duplicate mask patterns comprises a fourth mask pattern, a fifth mask pattern and a sixth mask pattern, each of the fourth mask pattern, fifth mask pattern and sixth mask pattern having a different bias.

15. A method of forming a recticle comprising the steps of:
providing a blank reticle; and
forming at least two duplicate mask patterns in the blank reticle, each of the at least two duplicate mask patterns having a different bias.

16. The method of claim 15, wherein the step of forming at least two duplicate mask patterns comprises the steps of:
exposing a photosensitive resist material layer to light to form an image corresponding to one of the at least two duplicate mask patterns having different biases;
removing portions of the photosensitive resist material layer to expose corresponding portions of an opaque material layer below the photosensitive resist material layer; and
etching the exposed portions of the opaque material layer to form one of the at least two duplicate mask patterns having different biases in the blank reticle.

17. The method of claim 15, wherein the step of forming at least two duplicate mask patterns comprises forming a first mask pattern, a second mask pattern and a third mask pattern, each of the first mask pattern, second mask pattern and third mask pattern having a different bias.

18. The reticle of claim 17, wherein the first mask pattern is not biased, the second mask pattern has a negative bias, and the third mask pattern has a positive bias.

19. A method of forming a semiconductor layer of a semiconductor device comprising the steps of:
interposing a reticle between an energy source and a semiconductor wafer, the reticle comprising at least two duplicate mask patterns each having a different bias; and
passing energy through one of the at least two duplicate mask patterns using the energy source to form an image on the semiconductor wafer, the one of the at least two duplicate mask patterns being chosen based on a required bias.

20. The method of claim 19, further comprising etching the semiconductor wafer using the image formed on the semiconductor wafer to form the semiconductor layer.

21. The method of 19, wherein the at least two duplicate mask patterns comprises a first mask pattern, a second mask pattern and a third mask pattern, each of the first mask pattern, second mask pattern and third mask pattern having a different bias.

22. The method of claim 21, wherein the first mask pattern is not biased, the second mask pattern has a negative bias, and the third mask pattern has a positive bias.

23. The method of claim 19, wherein the energy source is a stepper.

* * * * *